(12) United States Patent
Yu

(10) Patent No.: US 6,294,808 B1
(45) Date of Patent: Sep. 25, 2001

(54) NON-VOLATILE MEMORY CELL WITH FIELD-ENHANCING FLOATING GATE AND METHOD FOR FORMING THE SAME

(75) Inventor: Ta-Lee Yu, Hsinchu (TW)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 09/140,540

(22) Filed: Aug. 26, 1998

(51) Int. Cl.[7] .................................................. H01L 29/788
(52) U.S. Cl. ............................................. 257/317; 257/321
(58) Field of Search ..................................... 257/317, 321

(56) References Cited

U.S. PATENT DOCUMENTS

| | | | |
|---|---|---|---|
| 4,087,795 | * 5/1978 | Rossler | 257/321 |
| 5,242,848 | 9/1993 | Yeh | 437/43 |
| 5,267,194 | * 11/1993 | Jang | 257/327 |
| 5,278,087 | 1/1994 | Jenq | 437/43 |
| 5,502,668 | * 3/1996 | Shimoji et al. | 257/317 |
| 5,780,892 | * 7/1998 | Chen | 257/317 |

\* cited by examiner

*Primary Examiner*—Mark V. Prenty
(74) *Attorney, Agent, or Firm*—Finnegan, Henderson, Farabow, Garrett & Dunner, L.L.P.

(57) ABSTRACT

A non-volatile memory device includes a semiconductor substrate, first and second spaced-apart regions in the substrate and a channel region therebetween, a first dielectric layer disposed over the substrate, and a floating gate disposed over the first dielectric layer. The floating gate extends over a portion of the channel region and a portion of the second region, and includes a top portion, a bottom portion and at least five sides. The device also includes a second dielectric layer having first and second connected sections and a control gate disposed over a portion of the first dielectric layer and a portion of the second dielectric layer. The first section of the second dielectric layer is contiguous with at least two of the five sides of the floating gate and the second dielectric section is disposed over and contiguous with the top portion of the floating gate.

15 Claims, 6 Drawing Sheets

NON-VOLATILE MEMORY CELL WITH FIELD-ENHANCING FLOATING GATE AND METHOD FOR FORMING THE SAME

BACKGROUND OF THE INVENTION

1. Field of the Invention

This invention pertains in general to a non-volatile memory device and, more particularly, to a non-volatile memory device with field-enhancing floating gate and a method for forming the same.

2. Description of the Related Art

A non-volatile memory device may be programmed through Fowler-Nordheim tunneling or "hot" electron injection. Hot electrons are those with high kinetic energy and may be acquired through a locally-enhanced electric field. Some electrons in the channel region of the device substrate may be induced through either Fowler-Nordheim tunneling or hot electron injection to penetrate a dielectric layer that separates the substrate from a floating gate. When the electrons have penetrated the dielectric layer and stored at the floating gate, the device is said to be programmed. The stored electrons may be removed from the floating gate through a control gate, or select gate, that overlaps the floating gate. The floating gate and the control gate are separated by a second dielectric layer. With Fowler-Nordheim tunneling, the electrons stored in the floating gate may be induced to tunnel through the second dielectric layer to the control gate. After the stored electrons are removed from the floating gate, the device is said to be erased.

U.S. Pat. No. 5,278,087 ("the '087 patent") discloses a method of making a single transistor non-volatile electrically alterable semiconductor memory device with a re-crystallized floating gate. U.S. Pat. No. 5,242,848 ("the '848 patent") discloses a self-aligned method of making a split gate single transistor non-volatile electrically alterable semiconductor memory device.

FIG. 1 is a cross-sectional side view of a single transistor non-volatile electrically alterable memory cell disclosed in the '087 and the '848 patents. Referring to FIG. 1, a memory cell 10 includes a semiconductor substrate 12. Substrate 12 includes a drain region 16, a source region 14 and a channel region 18 therebetween. Disposed over substrate 12 is a first layer 20 of dielectric material, which may be composed of silicon dioxide, silicon nitride, or silicon oxynitride. A polysilicon floating gate 22 is disposed over first layer 20 and overlaps a portion of channel region 18 and a portion of source region 14. A second dielectric layer 25 has a first section 24 disposed over floating gate 22 and a second section 26 adjacent to floating gate 22. Layer 25 may be composed of silicon dioxide, silicon nitride, or silicon oxynitride.

Cell 10 also includes a control gate 29 having a first portion 28 and a second portion 30. First portion 28 is disposed over first portion 24 of layer 25 and second portion 30 is disposed over layer 20 and contiguous with second portion 26 of layer 25. Second portion 30 also extends over a portion of drain region 16 and a portion of channel region 18.

Both the '087 and the '848 patents describe that cell 10 may be programmed by applying a ground potential to drain region 16, a threshold voltage to control gate 29, and a positive high voltage on the order of 12 volts to source region 14. Under such a bias condition, electrons from drain region 16 flow towards source region 14 through channel region 18. A locally generated electrical field in channel region 18 causes some of the electrons to become "hot", i.e., acquire kinetic energy. For those having acquired enough kinetic energy, some will inject into floating gate 22 through layer 20.

The '087 and '848 patents also describe that the electrons stored in floating gate 22 after programming may be removed through Fowler-Nordheim tunneling. By applying 15 volts to control gate 29 and a ground potential to source region 14 and drain region 16, the stored electrons will tunnel through layer 25 to control gate 29 and may be removed through control gate 29. Electron tunneling is attributed to a locally enhanced field from floating gate 22.

The '087 and the '848 patents are hereby incorporated by reference.

SUMMARY OF THE INVENTION

Accordingly, the present invention is directed to a non-volatile memory device with a field-enhancing floating gate and a method for forming the same that substantially obviate one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided a non-volatile memory device that includes a semiconductor substrate, first and second spaced-apart regions in the substrate with a channel region therebetween, and a first dielectric layer disposed over the substrate. The device also includes a floating gate disposed over the first dielectric layer. The floating gate extends over a portion of the channel region and over a portion of the second spaced-apart region, and includes a top portion, a bottom portion and at least five sides wherein the bottom portion is contiguous with the first dielectric layer. The device further includes a second dielectric layer having a first and a second connected sections wherein the first dielectric section is contiguous with at least two of the five sides of the floating gate and the second dielectric section is disposed over and contiguous with the top portion of the floating gate, and a control gate that has a first section disposed over the first dielectric layer and contiguous with the second dielectric layer.

In one aspect of the invention, a voltage of between approximately 0 and 0.6 volts is applied to the first spaced-apart region, a voltage of approximately 11 volts is applied to the second spaced-apart region, and a threshold voltage is applied to the control gate to inject electrons from the channel region into the floating gate.

In another aspect, a ground potential is applied to the first spaced-apart region and the second spaced-apart region, and a voltage of approximately 14 volts is applied to the control gate to induce Fowler-Nordheim tunneling of electrons from the floating gate to the control gate.

Also in accordance with the invention, there is provided a non-volatile memory device having a substrate and a first dielectric layer disposed over the substrate. The device includes a floating gate disposed over the first dielectric layer, wherein the floating gate has a top portion, a bottom portion, and a protrusion. The device also includes a second dielectric layer disposed over the floating gate and a control gate disposed over the second dielectric layer. The protrusion of the floating gate creates an enhanced local field to induce Fowler-Nordheim tunneling of electrons from the floating gate to the control gate when a high voltage is applied to the control gate.

Further in accordance with the invention, there is provided a method for forming a non-volatile memory device that includes the steps of defining a substrate, forming a first layer of dielectric material over the substrate, depositing a first layer of polysilicon over the first layer of dielectric material, masking the first polysilicon layer to define a floating gate, and patterning the first polysilicon layer to form a floating gate. The method also includes the steps of masking the floating gate to define at least five sides of the floating gate that includes one protrusion, and patterning and forming the floating gate to form the at least five sides and the one protrusion. The method additionally includes the steps of forming a second layer of dielectric material over the floating gate and the first dielectric layer, depositing a second layer of polysilicon over the second layer of dielectric material, masking the second polysilicon layer to define a control gate, patterning the second layer of polysilicon to form the control gate, and defining a source and a drain in the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

Figure 1:
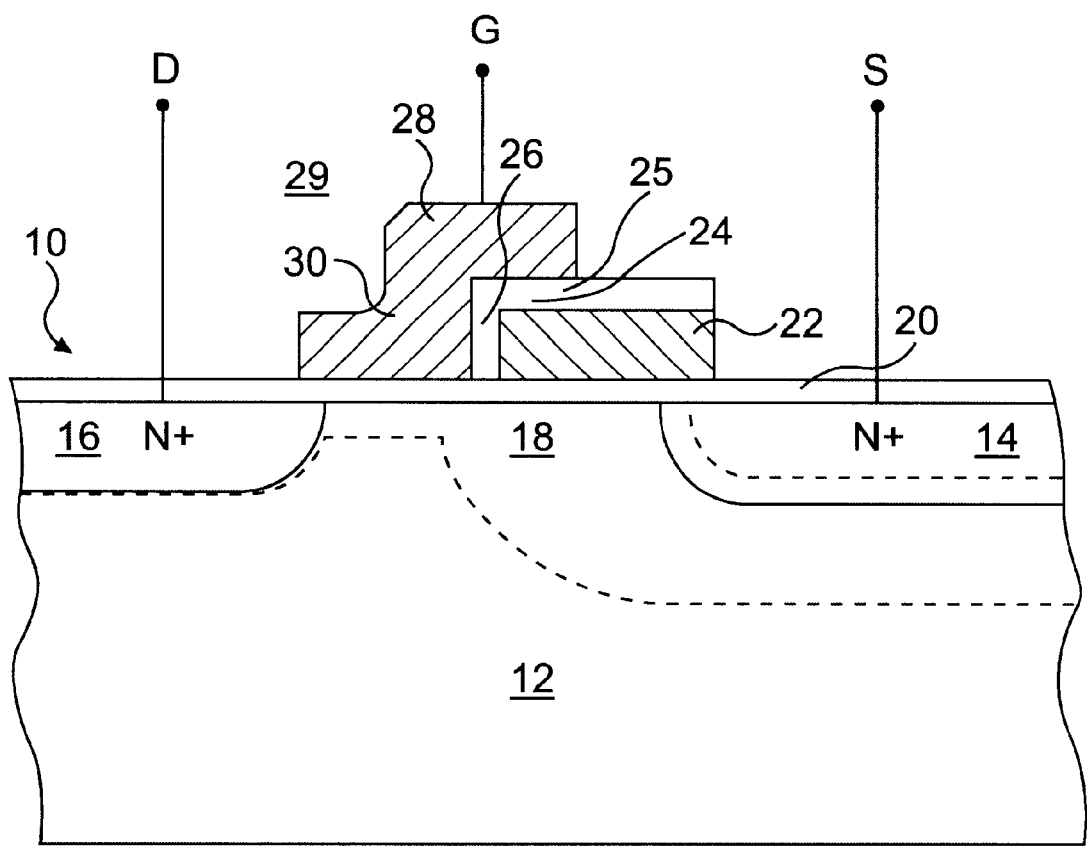
FIG. 1 is a cross-sectional side view of a known single transistor non-volatile electrically alterable memory cell.
Figure 2:
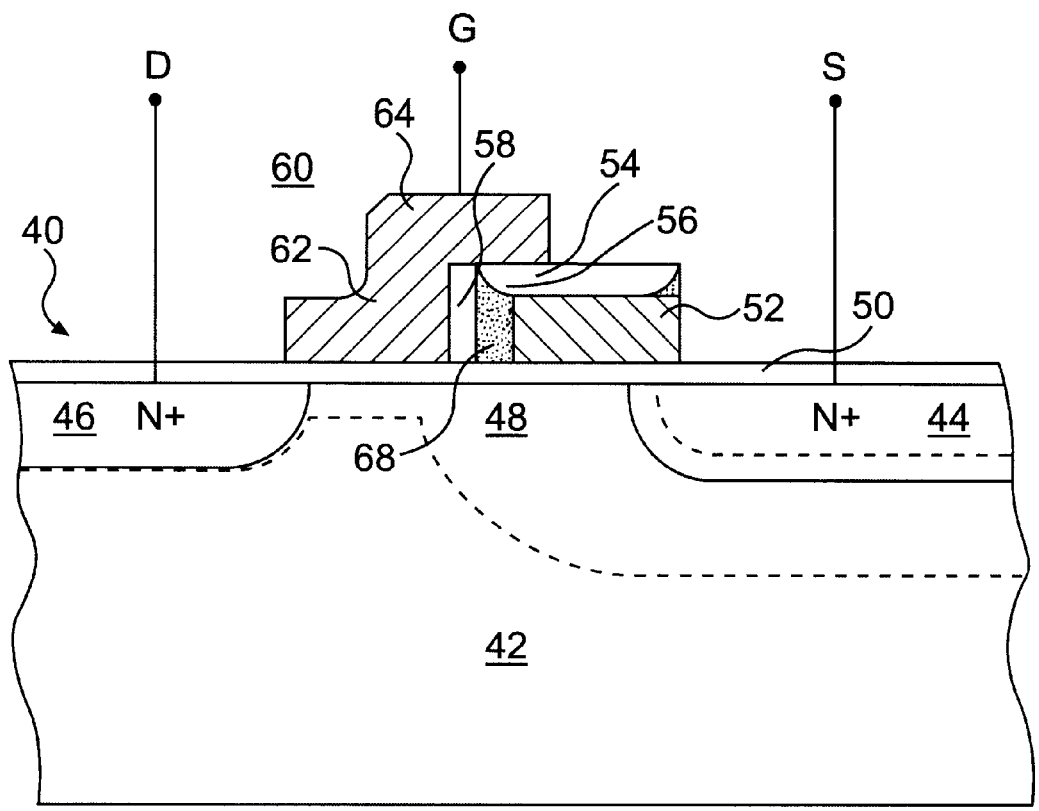
FIG. 2 is a cross-sectional side view of an embodiment of a non-volatile memory cell with a field-enhancing floating gate of the present invention.

In accordance with the present invention, there is provided a non-volatile memory device with field-enhancing floating gate and a method for forming the same. FIG. 2 shows an embodiment of the present invention. Referring to FIG. 2, a memory cell 40 includes a semiconductor substrate 42. Substrate 42 includes a drain region 46, a source region 44 and a channel region 48 therebetween. Disposed over substrate 42 is a first layer 50 of dielectric material of silicon dioxide, silicon nitride, or silicon oxynitride.

Figure 3:
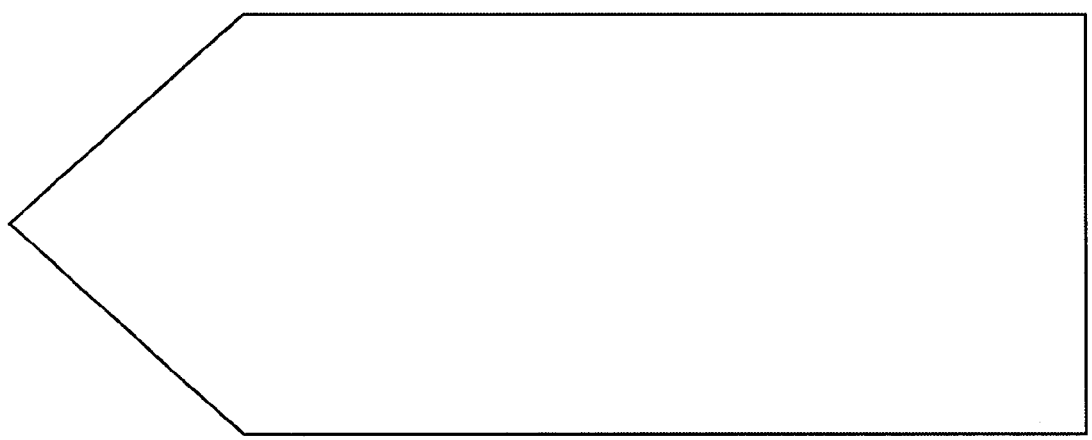
FIG. 3 is a top view of the field-enhancing floating gate of the memory cell shown in FIG. 2.
Figure 4:
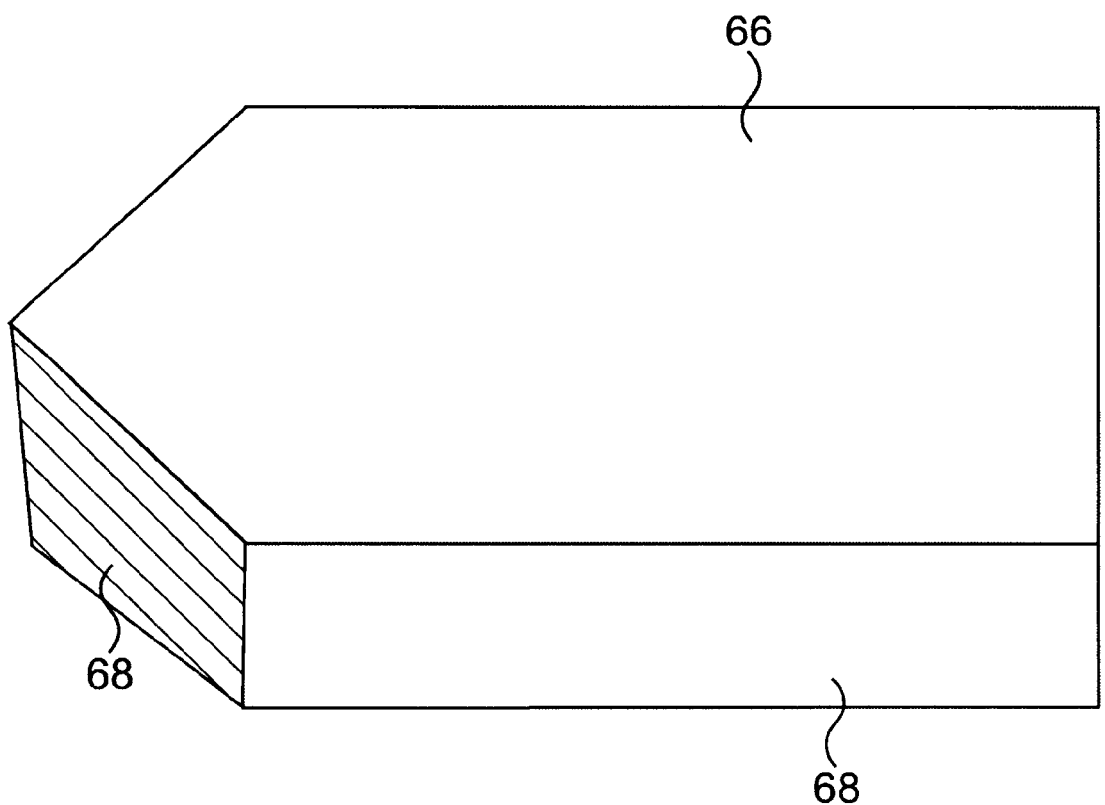
FIG. 4 is a perspective view of the field-enhancing floating gate shown in FIG. 3.

Cell 40 also includes a polysilicon floating gate 52 disposed over first layer 50. Floating gate 52 overlaps a portion of channel region 48 and a portion of source region 44. FIGS. 3 and 4 show in detail the shape of floating gate 52. FIG. 3 is a top view of floating gate 52 and shows that floating gate 52 has five sides. FIG. 4 is a perspective view of floating gate 52. Referring to FIG. 4, floating gate 52 has a top 66, a bottom surface (not shown), and five side surfaces 68. Referring again to FIG. 2, the bottom surface of floating gate 52 is contiguous with layer 50.

Cell 40 additionally includes a second dielectric layer 54 having a first portion 56 connected with a second portion 58. First portion 56 is contiguous with top surface 66 of floating gate 52 and second portion 58 is contiguous with two of the five side surfaces 68 of floating gate 52. Cell 40 also includes a control gate 60 having a first portion 64 and a second portion 62. First portion 64 is disposed over first portion 56 of second dielectric layer 54. Second portion 62 is disposed over layer 50 and contiguous with second portion 58 of second dielectric layer 54. In addition, second portion 62 extends over a portion of drain region 46 and a portion of channel region 48.

Figure 5:
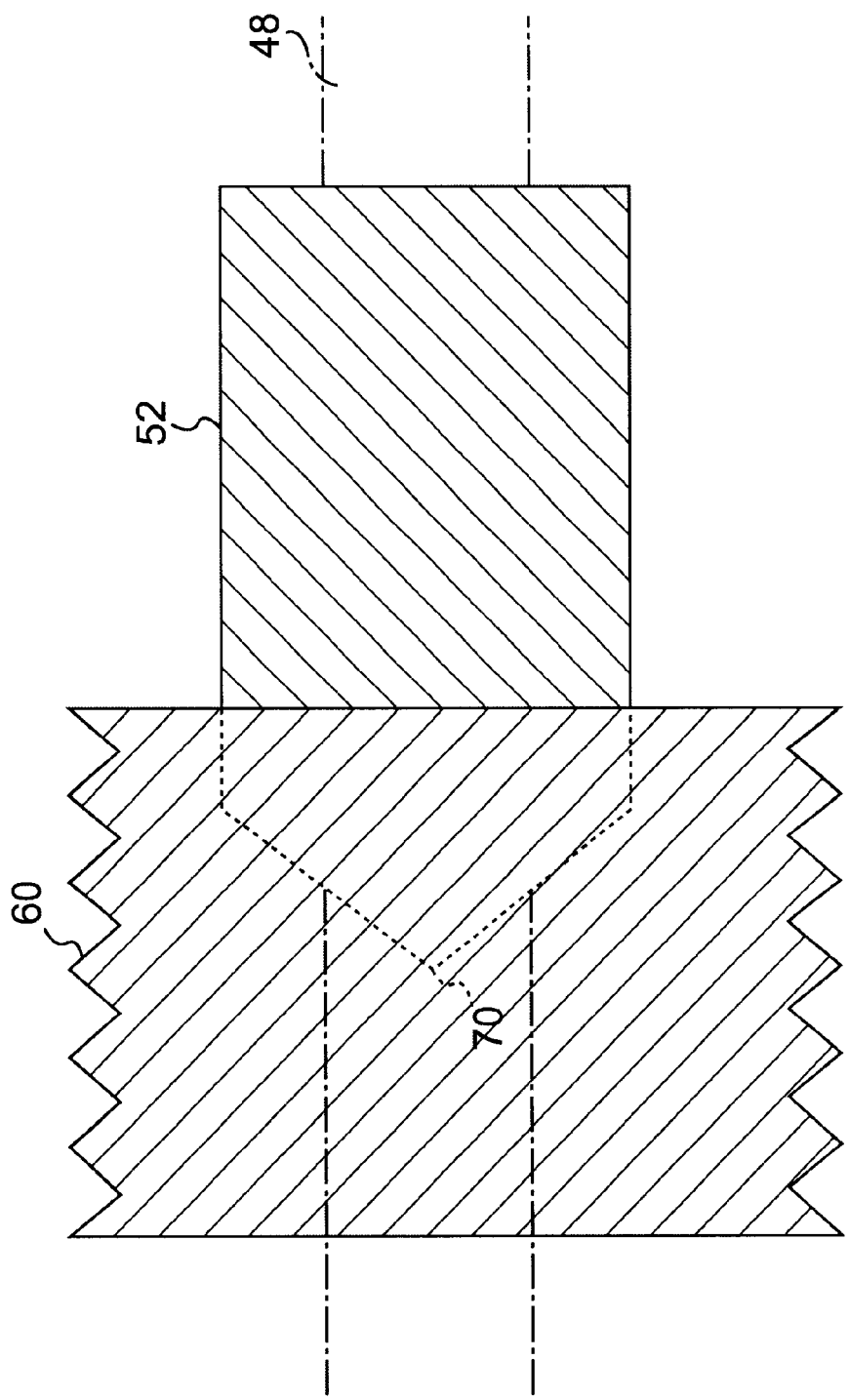
FIG. 5 is the layout of the memory cell shown in FIG. 2.

FIG. 5 shows the layout of cell 40 and the approximate boundary of channel region 48. Referring to FIG. 5, two of the five side surfaces 68 of floating gate 52 form a protrusion 70. Control gate 60 is disposed over both channel region 48 and floating gate 52. Disposed over channel region 48, the path by which electrons flow, protrusion 70 enhances the local electric field generated by floating gate 52 thereby improving programming and erasing efficiency. Both the injection of hot electrons and Fowler-Nordheim tunneling of electrons take place at protrusion 70.

Figure 6A:
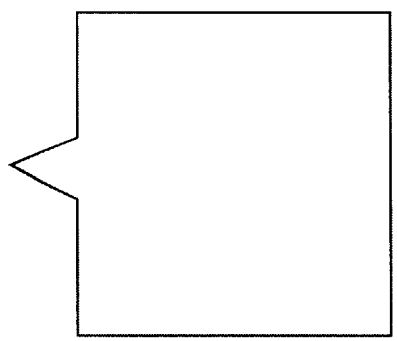
FIGS. 6A–6D are plan views of other embodiments of the field-enhancing floating gate of the present invention.
Figure 6B:
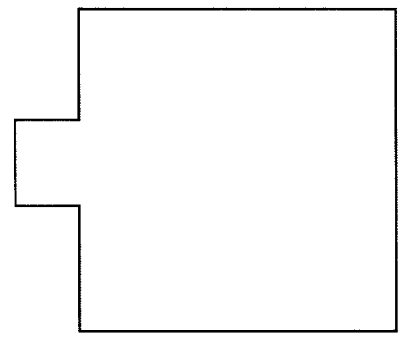
Figure 6C:
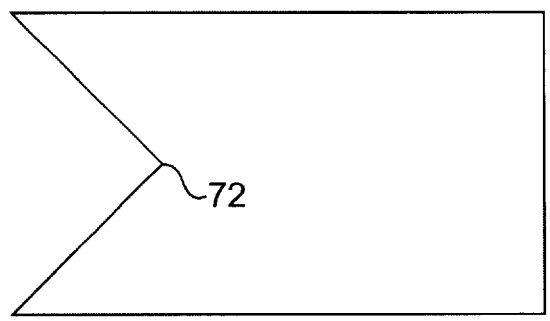
Figure 6D:
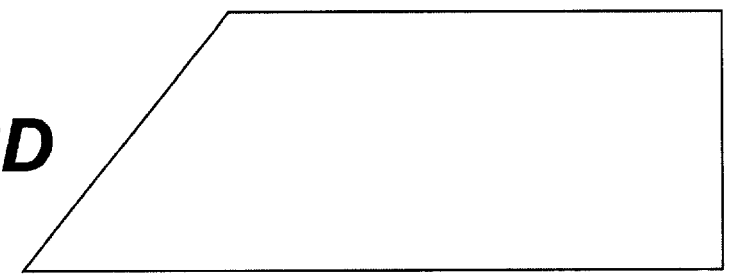

FIGS. 6A–6D show additional embodiments for a field-enhancing floating gate of the present invention. Specifically, FIG. 6A shows a plan view of a floating gate having seven sides and one protrusion formed by two of the seven sides. FIG. 6B shows a plan view of a floating gate having eight sides and one protrusion formed by three of the eight sides. FIG. 6C shows a plan view of a floating gate having five sides and two protrusions. The two protrusions form an indentation 72. In this embodiment, injection of hot electrons and Fowler-Nordheim tunneling of electrons take place at indentation 72. Finally, FIG. 6D shows a plan view of a floating gate having only four sides and one protrusion.

With references to FIGS. 2–5, to program cell 40, a ground potential of not more than approximately 0.6 volts is applied to drain region 46. A threshold voltage of approximately 2 volts is applied to control gate 60, and a high voltage of about +11 volts is applied to source region 44. Under this bias condition, electrons from drain region 46 flow towards source region 44 through channel region 48. The locally generated electric field in channel region 48 causes some of the electrons to accelerate. After acquiring sufficient kinetic energy, some of the hot electrons will be injected into floating gate 52 through layer 50. Because protrusion 70 enhances the locally generated electric field, more electrons acquire sufficient kinetic energy for hot electron injection, resulting in an improvement in programming efficiency. The injection of electrons continues until floating gate 52 can no longer sustain an electric field sufficient to generate hot electrons.

Cell 40 may be erased through Fowler-Nordheim tunneling. Still with reference to FIGS. 2–5, by applying 14 volts to control gate 60 and a ground potential to source region 44 and drain region 46, electrons stored in floating gate 52 will tunnel through layer 54 to control gate 60 and be removed through control gate 60. This tunnel takes place because strong coupling from floating gate 52 to substrate 42 and source 44 will cause a high voltage drop between floating gate 52 and control gate 60, which causes electrons to tunnel from floating gate 52 to control gate 60. Protrusion 70 enhances an electric field generated locally by floating 52 that facilitates electron tunneling, resulting in an improvement in tunneling, or erasing, efficiency. As electrons tunnel to control gate 60, the potential drop between floating gate 52 and control gate 60 decreases until the potential drop can no longer sustain a significant amount of Fowler-Nordheim tunneling.

The present invention may be manufactured generally by first growing first dielectric layer over a substrate. A first layer of a polysilicon is deposited over the first layer of dielectric material, and is masked and patterned to define a floating gate. Any embodiment of the floating gate of the present invention may be then patterned and formed. For certain embodiments of the floating gate, such as those shown in FIGS. 3 and 6A, two masking steps are preferred to form sharp protrusions. Specifically, a first masking step patterns and forms one side of protrusion 70 and a second masking step patterns and forms the other side of protrusion 70. A single step masking and formation step will likely result in a protrusion being rounded at its end. The manufacturing method continues by forming a second layer of dielectric material over the floating gate and the first dielectric layer. A second layer of polysilicon is deposited over the second layer of dielectric material. The second layer of polysilicon is then masked and patterned to form the control gate. Finally, source and drain regions are defined in the substrate. It will be apparent to those skilled in the art that various modifications and variations can be made in the disclosed process and product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A non-volatile memory device, comprising:
   a semiconductor substrate;
   first and second spaced-apart regions in said substrate and a channel region therebetween;
   a first dielectric layer disposed over said substrate;
   a floating gate disposed over said first dielectric layer and extending over a portion of said channel region and over a portion of said second spaced-apart region, said floating gate having a top portion, a bottom portion, at least five sides, and a protrusion, wherein said bottom portion is contiguous with said first dielectric layer;
   a second dielectric layer having first and second connected sections, said first dielectric section being contiguous with at least two of said at least five sides of said floating gate and said second dielectric section disposed over and contiguous with said top portion of said floating gate; and
   a control gate disposed over said first dielectric layer and said second dielectric layer, and extending over a portion of said first spaced-apart region;
   wherein said protrusion of said floating gate creates an enhanced local field to induce Fowler-Nordheim tunneling of electrons from said floating gate to said control gate when a high voltage is applied to said control gate.

2. The device as claimed in claim 1 wherein said first dielectric layer is silicon dioxide, silicon nitride, or silicon oxynitride.

3. The device as claimed in claim 1 wherein said second dielectric layer is silicon dioxide, silicon nitride, or silicon oxynitride.

4. The device as claimed in claim 1 wherein a ground potential is applied to said first spaced-apart region and said second spaced-apart region, and a voltage of approximately 14 volts is applied to said control gate to induce Fowler-Nordheim tunneling of electrons from said floating gate to said control gate.

5. A non-volatile memory device having a substrate and a first dielectric layer disposed over the substrate, comprising:
   a floating gate disposed over the first dielectric layer, said floating gate having a top portion, a bottom portion, at least five sides and a protrusion;
   a second dielectric layer disposed over said floating gate; and
   a control gate disposed over said second dielectric layer;
   wherein said protrusion of said floating gate creates an enhanced local field to induce Fowler-Nordheim tunneling of electrons from said floating gate to said control gate when a high voltage is applied to said control gate.

6. The device as claimed in claim 5 wherein said first dielectric layer is silicon dioxide, silicon nitride, or silicon oxynitride.

7. The device as claimed in claim 5 wherein said floating gate has two protrusions.

8. The device as claimed in claim 5, wherein said floating gate has a top portion, a bottom portion, seven sides and a protrusion formed by two of said seven sides.

9. The device as claimed in claim 5, wherein said floating gate has a top portion, a bottom portion, eight sides and a protrusion formed by three of said eight sides.

10. The device as claimed in claim 5, wherein said floating gate has a top portion, a bottom portion, five sides and two protrusions each formed of two of the five sides.

11. The device as claimed in claim 5 wherein said second dielectric layer is silicon dioxide, silicon-nitride, or silicon oxynitride.

12. A non-volatile memory device, comprising:
    a semiconductor substrate;
    first and second spaced-apart regions in said substrate and a channel region therebetween;
    a first dielectric layer disposed over said substrate;
    a floating gate disposed over said first dielectric layer and extending over a portion of said channel region and over a portion of said second spaced-apart region, said floating gate having a top portion, a bottom portion, at least five sides, and a protrusion, wherein said bottom portion is contiguous with said first dielectric layer;
    a second dielectric layer having first and second connected sections, said first dielectric section being contiguous with at least two of said at least five sides of said floating gate and said second dielectric section disposed over and contiguous with said top portion of said floating gate; and
    a control gate disposed over said first dielectric layer and said second dielectric layer, and extending over a portion of said first spaced-apart region;
    wherein a first voltage is applied to said first spaced-apart region and said second spaced-apart region, and a second voltage is applied to said control gate to create an enhanced electric field to induce Fowler-Nordheim tunneling of electrons from said floating gate to said control gate.

13. The device as claimed in claim 12, wherein said second voltage is greater than said first voltage.

14. The device as claimed in claim 12, wherein said floating gate has two protrusions.

15. The device as claimed in claim 12, wherein said floating gate has seven sides and said protrusion is formed by at least two of said seven sides.

* * * * *